US006766499B1

(12) United States Patent
Mbouombouo et al.

(10) Patent No.: US 6,766,499 B1
(45) Date of Patent: Jul. 20, 2004

(54) BUFFER CELL INSERTION AND ELECTRONIC DESIGN AUTOMATION

(75) Inventors: Benjamin Mbouombouo, San Jose, CA (US); Stefan Graef, Milpitas, CA (US); Juergen Lahner, Sunnyvale, CA (US)

(73) Assignee: LSI Logic Corporation, Milpitas, CA (US)

(*) Notice: Subject to any disclaimer, the term of this patent is extended or adjusted under 35 U.S.C. 154(b) by 490 days.

(21) Appl. No.: 09/828,553

(22) Filed: Apr. 5, 2001

(51) Int. Cl.[7] .............................................. G06F 17/50
(52) U.S. Cl. .............................. 716/10; 716/9; 716/6; 716/12
(58) Field of Search ............................ 716/6, 9, 10, 12

(56) References Cited

U.S. PATENT DOCUMENTS

| 5,396,435 | A  | * | 3/1995 | Ginetti ........................... 716/6 |
| 5,610,833 | A  |   | 3/1997 | Chang et al. .................. 716/11 |
| 6,173,435 | B1 | * | 1/2001 | Dupenloup ................... 716/18 |
| 6,347,393 | B1 | * | 2/2002 | Alpert et al. ................... 716/2 |
| 6,507,935 | B1 | * | 1/2003 | Aingaran et al. .............. 716/5 |
| 6,532,576 | B1 | * | 3/2003 | Mbouombouo et al. ....... 716/6 |
| 6,536,022 | B1 | * | 3/2003 | Aingaran et al. .............. 716/5 |
| 6,546,541 | B1 | * | 4/2003 | Petranovic et al. ............ 716/18 |

FOREIGN PATENT DOCUMENTS

| JP | 09091333  A | * | 4/1997 | ........... G06F/17/50 |
| JP | 2000172736 A | * | 6/2000 | ........... G06F/17/50 |
| JP | 2000222451 A | * | 8/2000 | ........... G06F/17/50 |

OTHER PUBLICATIONS

NN9501457, "Capacitance Target–Driven Cell Placement", IBM Technical Disclosure Bulletin, vol. 38, No. 1, Jan. 1995, pp 457–460 (8 pages).*
Pratapneni et al., "Development of chip model library for the computer–aided analysis of electronic packages", Fifteenth IEEE/CHMT International Electronic Manufacturing Technology Symposium, Oct. 6, 1993, pp. 417–422.*
Chu et al., "A Quadratic Programming Approach to Simultaneous Buffer Insertion/Sizing and Wire Sizing", IEEE Transactions o Computer–Aided Design of Integrated Circuits and Systems, vol. 18, No. 6, Jun. 1999, pp. 787–798.*
Chu et al., "A New Approach to Simultaneous Buffer Insertion and Wire Sizing", 1997 IEEE/ACM International Conference on Computer–Aided Design, Nov. 9, 1997, pp. 614–621.*
Chung et al., "Optimal Buffered Clock Tree Synthesis", Proceedings of Seventh Annual IEEE International ASIC Conference an Exhibit, Sep. 19, 1994, pp. 130–133.*

* cited by examiner

*Primary Examiner*—Matthew Smith
*Assistant Examiner*—Phallaka Kik
(74) *Attorney, Agent, or Firm*—Fitch, Even, Tabin & Flannery (57) ABSTRACT

A computer readable medium encoded with instructions for executing the steps of: receiving information about a driving cell from a layout tool, receiving information about an interconnect from a layout tool, determining buffer cell information based upon information about the driving cell and the interconnect by accessing a previously defined library lookup table, relaying the buffer cell information from the library look up table to the layout tool.

18 Claims, 3 Drawing Sheets

BUFFER CELL INSERTION AND ELECTRONIC DESIGN AUTOMATION

BACKGROUND OF THE INVENTION

The present invention relates to electronic design, and more particularly to computer aided electronic design tools. Even more particularly, the present invention relates to computer aided design with buffer insertion functionality.

Electronic design automation (EDA) tools, or computer aided design (CAD) tools are used by designers of electronic circuits to create representations of circuit configurations, including representations of electronic cells (e.g., transistors), and interconnects between them. Because commercially available electronic design automation (EDA) tools allow designers to construct circuit layouts and simulate the performance of the circuit using a computer, without requiring the costly and lengthy process of fabrication and design, these electronic design automation tools are very useful.

Modern electronic circuits are often designed to perform tasks very quickly; thus must be designed so that signals traveling within the circuits are timed properly to successfully perform the tasks. A problem faced by designers is signal transmission delay throughout the electronic circuit caused by the electronic cells and the interconnects between them. Recent and continuing technical advances in the art of circuit fabrication, allowing the construction of sub-micron electronic cells, has decreased the delay introduced by the electronic cells (cell delays) and thus has increased the delay in signal transmission introduced by the interconnects (interconnect delays), due primarily to resistance and capacitance, relative to the cell delays. As a result, the interconnect delays often exceed the cell delays.

To reduce ramp delays caused by the resistance and capacitance of the interconnect(a form of interconnect delay), buffer cells are inserted within the interconnect. The buffer cells themselves, however, introduce gate delays into the interconnect, and therefore, there exists a tradeoff between reducing ramp delays and minimizing gate delays. For a given application, there exists a number of buffer cells (in part dependent on the type of buffer cell) that represents a balance between the ramp delay and the gate delays in an interconnect structure that meets both signal propagation and timing constraints.

One method of establishing this number of buffer cells, when there is only one receiving cell, involves inserting buffer cells based solely upon the length of the interconnect. This method however, only roughly approximates the number of buffer cells because parameters of the driving electronic cell (driving cell), and the signal output of the driving cell, are not utilized in connection with the parameters of the interconnect, such as capacitance, resistance, and inductance.

Another method includes laying out the interconnects between electronic cells and then inserting buffer cells based upon the designer's best estimation. The method then involves performing a computer implemented analysis, such as using a SPICE analysis, that calculates the signal propagation delay and/or attenuation for that design based upon the actual parameters of the driving cell, buffer cells and interconnect. The designer then adjusts the number, location, and/or type of the buffer cells in hopes of improving the signal propagation delay and/or attenuation, and again performs a computer implemented analysis to determine if a more optimal number, placement and/or type of buffer cell can be found. This approach may require many iterations before an optimal number, placement and type of buffer cells is determined. Further, each iteration is often time consuming because the calculations are done real time. Therefore, this iterative or "trial and error" approach, while more accurate than the previously discussed "pure length" approach, is too time consuming for practical use if a desired number, placement and type of buffer cells is to be determined.

There exists, therefore, a need for a system and method that are able to quickly and accurately determine, for a particular interconnect, the types and number of buffers to maintain signal speed within tolerance, and reduce uncertainly in signal propagation to ensure signal timing constraints are met. The present invention advantageously addresses the needs above as well as other needs.

SUMMARY OF THE INVENTION

The present invention advantageously addresses the needs above as well as other needs by providing a computer aided design system for buffer insertion.

In one embodiment, the invention can be characterized as a computer readable medium encoded with instructions for executing the steps of: receiving information about a driving cell from a layout tool, receiving information about an interconnect from a layout tool, determining buffer cell information based upon information about the driving cell and the interconnect by accessing a previously defined library lookup table, relaying the buffer cell information from the library look up table to the layout tool.

In another embodiment, the invention can be characterized as a method comprising the steps of: generating a library lookup table, receiving information about a driving cell and an interconnect from a layout tool, determining buffer cell information by accessing the library lookup table, relaying the buffer cell information from the library look up table to the layout tool.

In a further embodiment, the invention can be characterized as a buffer insertion system comprising: a library lookup table, receiving means for obtaining information about a driving cell and an interconnect from a layout tool, buffer determination means for obtaining at least one type of buffer cell, a quantity of buffer cells, and a distance between buffer cells from the library lookup table based upon a net length and the information about the driving cell, sending means for delivering the at least one type of buffer cell, the quantity of buffer cells, and the distance between buffer cells to the layout tool.

In an additional embodiment, the invention can be characterized as a buffer insertion system comprising: a memory, the memory storing electronic design automation (EDA) software, an interconnect data set, and a driving cell data set, wherein each of the interconnect data set and the driving cell data set have multiple data fields for storing data values; a database, the database storing a library lookup table with predetermined data relating the driving cell data set and the interconnect data set to predetermined buffer cell information; a CPU connected to the memory, the CPU providing the predetermined buffer cell information-to the Electronic Design Automation software wherein the providing includes: receiving a predetermined buffer cell information request from the EDA software, the interconnect data set, and the driving cell data set; selecting a predetermined buffer cell information from the database; sending the predetermined buffer cell information to the memory.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
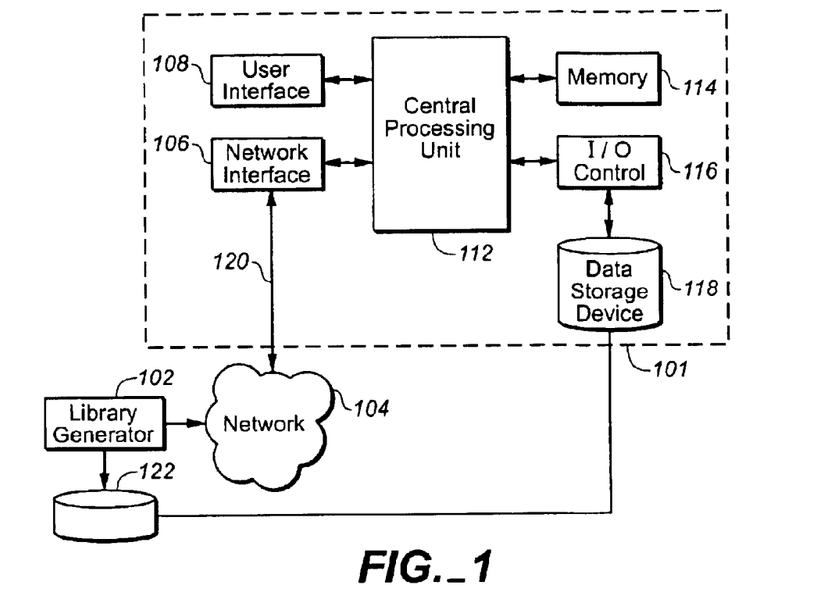
FIG. 1 is a block diagram depicting the hardware environment of a buffer insertion system in accordance with one embodiment of the invention.

Referring first to FIG. 1, shown is a block diagram depicting a hardware environment employing a buffer insertion system 101, a library generator 102, a network 104, and a removable medium 122. Components of the buffer insertion system 101 include a central processing unit (CPU) 112, a network interface 106, a user interface 108, a memory 114, an I/O control 116 and a data storage device 118.

The network interface 106, the user interface 108, the memory 114 and the I/O control 116 are all connected to the central processing unit 112 and in the present embodiment may all be integrated within a personal computer and interconnected via a system bus. Those of ordinary skill in the art will readily appreciate other types of system architectures may be used that allow data to be transferred among these or similar elements, e.g., Direct Memory Access, provided by some computer bus architectures. By way of example, Direct Memory Access allows data to be sent directly from an attached data storage device (such as a disk drive) to the memory 114 without the data traveling through the CPU 112. Further alternative architectures are readily contemplated, and well within the scope of the present embodiment.

The user interface 108 is operatively coupled via communication lines to the CPU 112 and may consist of one or more user terminals, e.g., a display screen and a keyboard (not shown).

The network interface 106 is preferably connected to the network 104 via a communication network link 120. In the present embodiment, the network 104 is the Internet. The network interface 106 is operatively coupled through the network 104 to a library generator 102. The library generator 102 may be a general purpose computer having many of the same hardware components of the buffer insertion system (e.g., a central processing unit (CPU), a network interface, a user interface, a memory, an I/O control and a data storage device) that is capable of executing circuit analysis software such as SPICE.

It will be apparent to those of ordinary skill in the art that the network 104 may be a combination of networks linked through gateways, switches routers and other types of communication linkages.

The I/O control 116 is further connected to the data storage device 118. The data storage device 118 may be a magnetic or optical disk or magnetic tape storage device, including, for example, removable disk and/or tape storage devices and/or any other form of mass data storage device capable of storing digital data.

Further detailed description of the components of the buffer insertion system 101 will not be included herein, it being understood from the descriptions provided herein that those of ordinary skill in the art are able to configure appropriate networks and computing devices to accomplish the principles of the present embodiment as further described.

Figure 2:
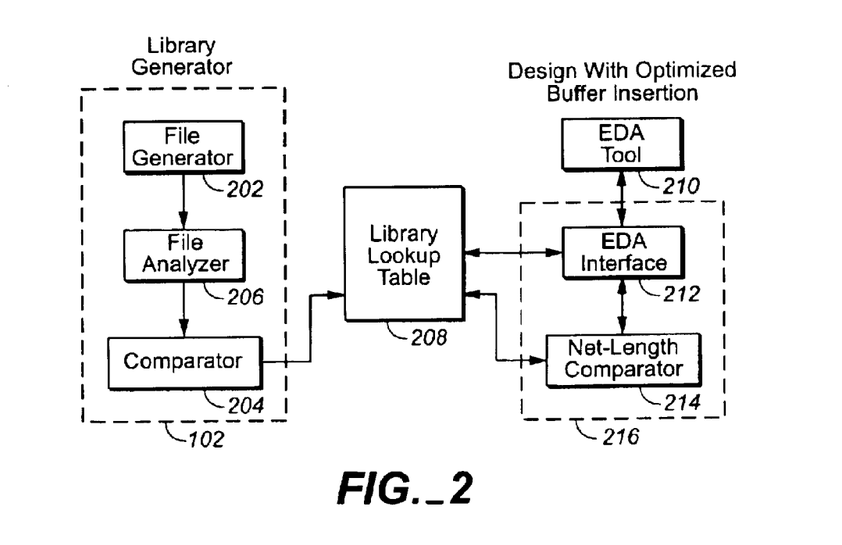
FIG. 2 is a functional block diagram representing components, both hardware and software, making up the embodiment of FIG. 1.

In practice, the library generator 102, described further in reference to FIG. 2, creates library data sets wherein each library data set includes data elements that represent operating characteristics, e.g., signal delay, for particular driving cells and interconnects. These library data sets may be used, as described in reference to FIG. 4, to provide preferred number, type and location of buffers for a particular interconnect, driving cell and signal combination. In other words, the library data sets contain data that provides the number (if any), type and locations of buffers that are needed to maintain important signal characteristics, e.g., power and speed, across the span of an interconnect. The library data sets may include, but are not necessarily limited to the following parameters: input ramp time, driving cell, interconnect type (e.g, the physical components and structure), hanging capacitance, interconnect length, total cell delay (driving cell delay and interconnect delay) and associated buffer detail (e.g., buffer type, number of buffers and locations of buffers along the interconnect). In the present embodiment, these library data sets are transferred via the network 104 through the network interface 106 and are routed through the system bus (not shown) to the storage device 118, wherein, as discussed in reference to FIG. 2., the library data sets are arranged in a library lookup table 208. Alternatively, the library data sets could be stored on a removable medium 122 such as a magnetic floppy disc or optical CD-ROM and provided, for example, by traditional mail to the buffer insertion system 101 wherein the data file may be-accessible from the removable medium via floppy disk drive or CD ROM drive or, alternatively, the library data sets may be transferred to the storage device 118 from the removable medium 122 and accessed therefrom.

In the present embodiment, the memory 114 serves to store components of an electronic design automation program and related data while the program is activated so that the instructions from the electronic design automation tool 210 and data may be operated upon by the CPU 112.

Referring next to FIG. 2, a functional block diagram representing components, that include both hardware and software, making up the buffer insertion system 101 is shown.

Shown are a file generator 202, an analyzer 206, a comparator 204, a library lookup table 208, and electronic design automation tool 210, a buffer insertion module 216, an electronic design automation tool interface 212, and a net-length comparator 214.

Figure 3:
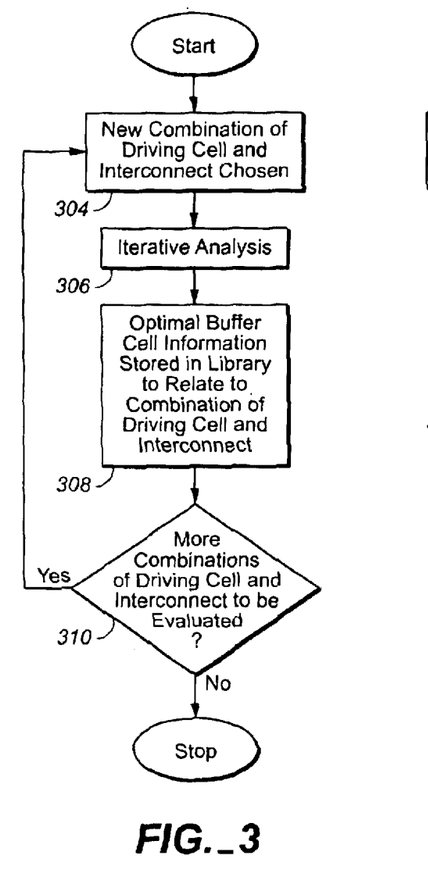
FIG. 3 is a flow chart describing the steps traversed in generating a library for the buffer insertion system of FIGS. 1 and 2.

The file generator 202, as discussed further herein and in reference to FIG. 3, is preferably a general purpose computer with software that creates test data sets including combinations of potential interconnect parameters such as: driving cell, input ramp time, interconnect length and type (e.g., the physical components and dimensional structure), interconnect length and buffer information including: type, location along the interconnect and quantity.

The file analyzer 206 may be any simulation software that is able to simulate a circuit's, e.g., driving cell coupled via an interconnect with or without one or more buffer cells, response to a particular signal. SPICE and SPICE derivatives are commonly used circuit simulation programs. First developed at the University of California, Berkeley, SPICE is now commercially available from numerous sources including, Cadence Design Systems, Inc. of San Jose, Calif. and CAD-Migos Software Tools, Inc of San Francisco, Calif. Modifications need not be made to the file analyzer 206 to implement the present embodiment of the invention because the output of the file generator 202 may be tailored to the specific software employed as the file analyzer 206. For example, where SPICE is used as the file analyzer 206, the file generator 202 provides a SPICE deck (a collection of information representing a circuit that is readable by SPICE) for each analysis.

The file generator 202 is connected to the file analyzer 206; the file analyzer 206 is connected to the comparator 204.

The comparator 204 is coupled to the library lookup table 208. This may be through the network 104 or, the comparator 204 may be communicatively coupled with the library lookup table 208 via the removable medium 122.

The library lookup table 208 is further coupled to the electronic design automation interface 212 and the net-length comparator 214. This may be through the communications bus of a computer or in other variations through the network 104 which may be the Internet, a LAN or WAN or other type of network. The electronic design automation tool 210 is connected to the electronic design automation interface 212. The electronic design automation tool interface 212 and the net-length comparator 214 are functional components of the buffer insertion module 216 as discussed further in reference to FIG. 4.

In practice, the file generator 202, the file analyzer 206 and the comparator 204 collectively define the library generator 102 of the present embodiment. The library generator 102 may be a general purpose computer wherein each of the operational steps taken by the file generator 202, the file analyzer 206, and the comparator 204 are dictated by software and carried out by the general purpose computer.

The purpose of the library generator 102 is to create library data to be accessed later when layout on the electronic design automation tool 210 is performed. The library generator 102, as discussed further in reference to FIG.3 in the paragraphs that follow, creates a library look up table that may be subsequently accessed, as discussed in reference to FIG. 4, to obtain a critical net length and buffer cell insertion information, e.g., buffer type, quantity and location. The critical net length is the longest interconnect length where buffer insertion is unnecessary to meet designated signal propagation tolerances. For example, if a certain minimum signal propagation speed is required over an interconnect path, the critical net length is that length where longer interconnects should have at least one buffer to reduce ramp delays and maintain signal transmission within tolerances as determined by the requirements of each circuit design. Additionally, the library data sets are useful for addressing interconnect lengths longer than the critical net length. The library data sets provide the buffer cell type and net length that may be implemented to meet total cell delay constraints for a particular input ramp delay. In other words, the library look up table 208 provides the type of buffer cell and the critical net length that may be driven by that buffer cell to meet signal propagation constraints, e.g., signal delay, within tolerance for a particular driving cell and interconnect structure. More specifically, these library data sets provide a user of the electronic design automation tool 210 with buffer insertion information, e.g., the type, number and location along the interconnect to meet performance constraints based upon the input ramp time and designed interconnect length. Because input ramp time is a function of signal frequency, and the interconnect type, the library data sets represent a combination of driving cell type, signal frequency, interconnect type and length, buffer cell type and buffer location information. Typically, these library data sets provide buffer insertion information that is used to reach a balance between reducing ramp delays in an interconnect while maintaining buffer gate delays low enough to meet the performance constraints.

Referring next to FIG. 3, shown is a flow chart describing the steps (performed by the library generator 102) for carrying out the generation of a library, and specifically, the generation of the library data sets.

The first step in the library generation, performed by the file generator 202, is the creation a first combination of driving cell type, interconnect type, and signal frequency (Step 304). The particular combination first chosen for analysis is not critical because all combinations of viable driving cell type, interconnect type, and signal frequency are analyzed. In other words, all driving cell types, interconnect types, and signal frequencies that may be implemented in a circuit are identified and provided to the file generator 202. The file generator 202 creates combinations and each combination is simulated in successive iterations until all combinations have been generated. The driving cell type may be any type of electronic component that supplies an input to another electronic component, e.g., transistors, flip-flops etc. The interconnect type may be any configuration of materials, e.g., metals, that comprise a given interconnect structure. The driving cell type and interconnect types are then supplied as test data sets which represent their respective electrical characteristics, e.g., in the case of the driving cell, data relating to the driving strength and input capacitance are supplied, and in the case of the interconnect, data relating to the sheet resistance, the fringe capacitance and plate capacitance is supplied.

The next step involves an iterative analysis (Step 306). Initially, the iterative analysis involves determining the longest interconnect length (otherwise known as a critical net length) for a signal frequency, driving cell, and interconnect type before buffer insertion is desirable. In other words, the critical net length is the longest interconnect length before buffer insertion is required within the interconnect to maintain desired signal degradation at the receiving end, e.g. receiving cell, within tolerance. This critical net length is typically that threshold point where the delays due to ramp times are just less than or equal to the gate delay from the introduction of a buffer.

For a first combination of driving cell type and interconnect type an iterative process of performing circuit simulation, e.g., a SPICE analysis, with a particular signal frequency (e.g., clock speed), with varying interconnect lengths is performed. For each interconnect length of the first combination of driving cell and interconnect type, until the critical net length is reached, simulations with the file analyzer 206 are made with and without buffer cell information and the results of each simulation are temporarily stored and thereafter compared by the comparator 204 to determine whether a particular buffer cell is necessary to maintain signal characteristics within desired tolerances. In other words, for a particular signal frequency, simulations with and without buffer cell(s) are performed with the first combination of driving cell type and interconnect type remaining the same while the interconnect length is varied. For example, to begin with, for a particular signal frequency, a minimum interconnect length is chosen as a first test length. The minimum length is a length at which signal degradation becomes significant due to wire resistance and capacitance—typically that length where the impedance due to the minimum length interconnect is just greater than cell driver output impedance. This minimum interconnect length is not only the first interconnect length in the analysis (the first test length), it is also the incremental value by which the test length is increased during each iteration. It should be noted that the minimum interconnect length is a function of interconnect material, size and signal frequency; therefore, the minimum interconnect length will vary depending upon the interconnect and signal under analysis. This test length (initially the minimum interconnect length) is first simulated by the file analyzer 206 without a buffer cell. Then, for that same test length, buffer cell simulation(s) are performed, i.e., a different simulation is performed (for the same test length) for each buffer cell type that may be applicable (e.g., that may reduce ramp delays). Stated differently, at least one buffer cell type is simulated for the test length, but many simulations (as many simulations as there are buffer cell types), may be performed wherein each simulation is done with a different buffer cell type. The results of the first simulation, i.e. the simulation without a buffer cell, are then compared by the comparator 204, to the buffer cell simulation(s). If the signal propagation characteristics are more desirable without a buffer cell in the interconnect than with a buffer cell, e.g., signal delay is less without the buffer(s) cell in the interconnect, then the test length is increased by the minimum interconnect length and the same process of comparing signal propagation characteristics without a buffer cell to signal propagation characteristics with buffer cell(s) is performed. If, on the other hand, the signal propagation characteristics with any one of the buffer cell types within the interconnect are more desirable than the signal propagation characteristics without a buffer cell, a critical net length, equal to the test length presently under analysis minus the minimum length, is established for that particular combination of driving cell type, interconnect type and signal frequency. It is noted that signal propagation characteristics, e.g. signal speed and signal power, are a function of the signal frequency; thus, for a particular driving cell type and interconnect type, there may be an entire family of critical net lengths wherein each critical net length member of the family relates to a particular signal frequency.

Further, for each signal frequency, there may be more than one critical net length depending upon the number of signal propagation characteristics, e.g., speed and/or power that are considered to be constraints. For example, a particular interconnect type with a particular signal frequency may have two critical net lengths depending upon the system (circuit) constraint—a critical net length when speed is the constraint and a different critical net length when power is the constraint. In other words, depending upon whether speed or power is the signal characteristic that is desired to fall within tolerance, that interconnect length may or may not be the critical net length. For example, for a particular interconnect type and signal frequency, if speed is critical to the circuit design, the critical net length may be different than an application where power is critical to the design. Therefore, for the first combination of driving cell type and interconnect type there may be a family of critical net lengths (each member of that family relating to a particular frequency) and each critical net length member within such a family may be either a speed critical net length or a power critical net length.

Those skilled in the art will readily appreciate that the combinations of driving cell type, input ramp time (calculated from interconnect type and signal frequency and driving cell type), interconnect length, buffer cell and signal type may be analyzed in a different order than presented. For example, rather than starting with a short interconnect length and incrementally increasing the interconnect length in each iteration, a long interconnect length may be chosen to begin with, and subsequently shorter interconnects analyzed in each iteration until the critical net length is found.

Once a critical net length is reached, a library data set is created that includes, but is not necessarily limited to, information representing the first combination of driving cell type, interconnect type and signal frequency as well as that critical net length for the particular signal characteristic, e.g., total cell delay to be maintained. The library data set, while representing this collection of information, is preferably condensed into the simpler representation with the input ramp time calculated from the combination of driving cell, signal frequency, interconnect type and interconnect length. For example, a library data set is preferably made up of a total cell delay (driving cell delay and interconnect delay) and output ramp time for a combination of driving cell type, input ramp time, and the critical net length. This library data set is then stored in the library lookup table 208 (step 308). As discussed further herein in reference to FIG. 4, the electronic design automation tool 210 accesses the library lookup table 208 via the buffer insertion module 216 during global routing to quickly determine whether an interconnect length, as routed, exceeds the critical net length; thus requiring buffer cell insertion.

A more detailed description of the method for generating the library look up table 208 is described in the pending U.S. Patent Application, filed Mar. 7, 2001, entitled CELL INTERCONNECT DELAY LIBRARY FOR INTEGRATED CIRCUIT DESIGN, by Mbouombouo, et al., and identified by Attorney Docket No. 68538 incorporated herein by reference. This application describes the creation of a table containing total cell delay (driving cell delay and interconnect delay) and output ramp time for a plurality of driving cell types, input ramp times, and interconnect lengths. Advantageously, this method simplifies the library look up table because data relating to signal frequency, and interconnect type are taken into account by the input ramp time; therefore, reducing the number of data elements in the library lookup table 208. In other words, as discussed in reference to FIG. 4, data may be accessed, e.g., a preferred buffer cell, from the library lookup table 208 with a timing constraint, e.g., acceptable signal delay, input ramp time and interconnect length.

Those skilled in the art will recognize many different readily available algorithms exist to extract optimal or favorable combinations of data and these algorithms may be implemented in software and performed on a general purpose computer. Because library generation is performed "off line," before the designer performs circuit routing, the effectiveness of the present invention is substantially independent of the efficiency of the library generation; therefore, the various methods known in the arts may work for purposes of this invention equally well.

After the data set(s) containing critical net length and buffer insertion information for the first combination of driving cell type and interconnect type is determined, a decision is made whether more combinations of driving cell type and interconnect type are to be evaluated (Step 310). If so, a second combination of driving cell type and interconnect type is established by the file generator 202, and the entire process explained above for the first combination of driving cell type and a interconnect type is performed for a second combination of driving cell type and a interconnect type. This entire process is repeated for all desired combinations of driving cell type and interconnect type. Therefore, the library lookup table 208, includes, but is not necessarily limited to data representing, multiple combinations of driving cell, interconnect length and signal frequency. For each combination of interconnect type, driving cell and signal frequency, the library lookup table 208 includes, but is not necessarily limited to, a critical net length and is accessible to perform buffer insertion, i.e., the buffer cell type, buffer cell quantity, and buffer cell location information for interconnects longer than the critical net length may be extracted and utilized as discussed in reference to FIG. 4.

Referring again to FIG. 2, shown is the buffer insertion module 216. The buffer insertion module 216 functionally serves to accept information from the electronic design automation tool 210, e.g., input ramp time, interconnect type, driving cell and net length information, and relay information, e.g., buffer insertion information, from the library lookup table 208 to the electronic design automation tool 210. The buffer insertion module 216 is implemented by computer program operating on a general purpose computer and it electrically interfaces with the electronic design automation tool 210 with the electronic design automation tool interface 212. The electronic design automation tool interface 212 is the component of the buffer insertion module 216 that is designed to accept the type of data supplied by the electronic design automation tool 210 relating to the routing information and relay buffer insertion information, e.g., type, number and location back to the electronic design automation tool 210. As is readily apparent to those skilled in the art, the electronic design automation tool interface 212 is designed to accept the vendor specific exported data format of a particular electronic design automation tool in use.

The net-length comparator 214 is also a functional component of the buffer insertion module 216. As such, it is implemented via computer program—preferably integrated within the same program as the electronic design automation tool interface 212.

Figure 4:
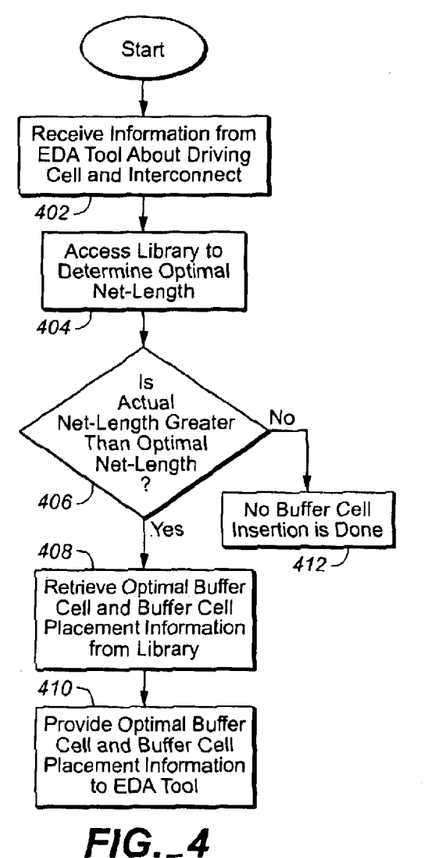
FIG. 4 is a flow chart describing the steps traversed by the buffer insertion system of FIGS. 1 and 2 in carrying out buffer insertion.

Referring next to FIG. 4, shown is a flow chart describing the steps carried out by the buffer insertion system 101 in operation.

In the first step, after placement and while global routing is performed on electronic design automation tool 210, the electronic design automation tool interface 212 receives the routing data from electronic design automation tool 210, including information representing the driving cell type, the input ramp time, signal frequency, net length and the interconnect type (Step 402). Alternatively, the driving cell and interconnect type may be identified by any means which allows a reference to the same driving cell type and interconnect type in the library lookup table.

Next, the net-length comparator 214 is accessed and provided with the routing data, e.g., interconnect information (e.g., information representing length of the designed interconnect), and driving cell information. The driving cell information includes input ramp time, which is a function of signal frequency. Therefore, the library lookup table 208, structured as described in the pending U.S. patent application entitled CELL INTERCONNECT LIBRARY FOR INTEGRATED CIRCUIT DESIGN, incorporated herein by reference above, is referenced by the input ramp time, and interconnect length. The net-length comparator 214 in turn accesses the library lookup table 208 (Step 404), and retrieves the data, e.g., the critical net length, associated with the input ramp time for the layout on the electronic design automation tool 210. In other words, the net-length comparator 214 receives the longest length (the critical net length) that an interconnect of the type used in the layout may have when used in conjunction with the driving cell used in the layout to stay within, for example, either speed or power constraints.

The net length comparator 214 then compares the length of the interconnect as designed, also known as a net length, with the critical net length to determine if the length of the interconnect as designed exceeds the critical net length (Step 406). If the interconnect as designed is shorter than the critical length, no buffer cell insertion is performed (Step 412).

If the interconnect as designed exceeds the critical net length, then the buffer cell information, e.g., the buffer cell type is identified within the library lookup table and is retrieved by the electronic design automation interface 212 (Step 408). For example, when the library lookup table 208 is formatted as described in the pending U.S. patent application entitled CELL INTERCONNECT LIBRARY FOR INTEGRATED CIRCUIT DESIGN, incorporated herein by reference above, for a given performance constraint, e.g., tolerable signal delay, and input ramp time, the buffer cell type and interconnect length to meet or fall under the tolerable signal delay is extracted. In other words, the buffer cell type to meet performance requirements is extracted. The library look up table 208, may be accessed as many times as necessary to analyze interconnects within a layout. For example, when a first buffer (i.e., a single buffer first inserted) cannot drive an entire interconnect, more than one access to the library lookup table 208 may be required. In such a case, the library look up table 208 is accessed again to obtain the critical net length for that first buffer and place a second buffer in the interconnect. Similarly, the library lookup table 208 may be accessed again if that second buffer cannot drive the remainder of the interconnect within performance tolerance. In this way, values representing the type, quantity, and location of the buffer cells to be inserted in the designed routing are received by the buffer insertion module 216. The electronic design automation interface 408 then, if necessary, converts the data that represents the buffer cell information to a vendor specific format that is readable by the electronic design automation tool 210.

Next, the buffer cell insertion information is provided to the electronic design automation tool 210 so that the buffer cells may be inserted within the designed routing (Step 410).

Figure 5:
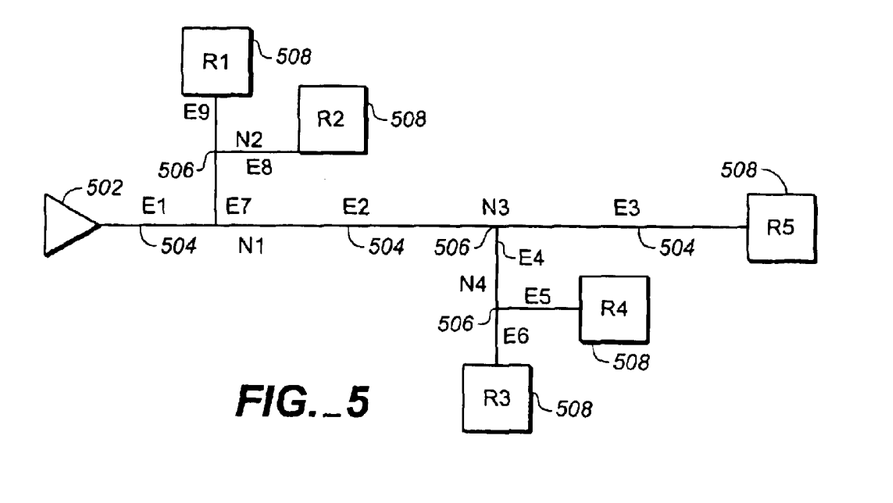
FIG. 5 is a graphical representation of an exemplary net (circuit layout) with fanout from a driving cell further illustrating the steps traversed by the buffer insertion system of FIGS. 1 and 2.

Referring next to FIG. 5, shown is a graphical representation of an exemplary net (configuration of cells and interconnects) with fanout from a driving cell further illustrating the steps traversed by the buffer insertion system of FIGS. 1 and 2.

There is a driving cell 502, interconnects 504 (labeled E1–E8), nodes 506 (labeled N1–N4) and receiving cells 508 (labeled R1–R5). The nodes 506, represent junction points where interconnects intersect.

In this example, the driving cell 502 is connected to node N1 via interconnect E1. At node N1 the net branches via interconnects E7 and E2 which terminate at nodes N2 and N3 respectively. At node N2, the net again branches via interconnects E9 and E8 which terminate at receiving cells R1 and R2 respectively. Node N1 connects to node N3 via interconnect E2. The net branches at node N3 along interconnects E3 and E4 which terminate at receiving cell R5 and node N4 respectively. The net branches once again at node N4 along interconnects E5 and E6 and terminate at receiving cells R4 and R3 respectively.

In practice, when the buffer insertion system 101 is faced with a net such as the net of FIG. 5, the buffer insertion module 216 begins at the driving cell 502 and analyzes the paths between the driving cell 502 and each receiving cell 508. In other words, a net such as is shown is FIG. 5, is broken down in separate paths and each path between the driving cell 502 and receiving cell 508 is analyzed as discussed in reference to FIG. 6.

The process of breaking down the net into separate paths begins with the buffer insertion module 216 receiving information (e.g., input ramp time and net length) from the electronic design automation tool 210 about the interconnect immediately downstream from the driving cell 502, e.g., interconnect E1. If a junction is reached, e.g., node N1, each branch emanating from that junction is analyzed in its entirety before going to the next branch. For example, one possible order that the interconnects in FIG. 5 may be analyzed is E1-E2-E4-E5-E6-E3-E7-E9-E8.

Figure 6:
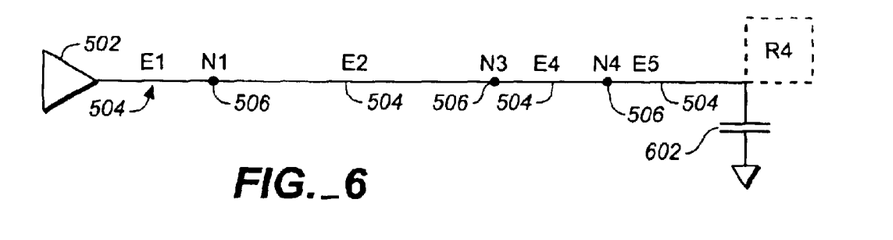
FIG. 6 is a schematic diagram representing a model of a path traversed by the buffer insertion system of FIGS. 1 and 2 from the driving cell to a receiving cell of FIG. 5.

Referring to FIG. 6, shown is a schematic diagram representing a model of a path from driving cell 502 to receiving cell R4 via interconnect segments E1, E2 and 24 and E5 for the net of FIG. 5. Shown is the driving cell 502, interconnects 504 (labeled E1, E2, E4 and E5), the receiving cell 508 (labeled R4), nodes 506 (labeled N1, N3 and N4) and hanging capacitance 602. The driving cell 502 is electrically coupled to the receiving cell 508 via the interconnects 504 comprised of sections E1, E2, E4 and E5. The hanging capacitance 602 is coupled with the interconnect 504 at the point where the receiving cell R4 couples with the interconnect.

The hanging capacitance represents the capacitance of the branches emanating from the path between the driving cell 502 to the receiving cell R4, in this case, the capacitance of the E7, E3, and E6 branches is lumped together as the hanging capacitance 602. Hanging capacitance is preferably incorporated into the library lookup table 208 so that buffer cell insertion may more accurately be performed to meet performance considerations. In other words, by including hanging capacitance in the library lookup table 208, a more accurate characterization of the net under analysis may be made; therefore, facilitating more accurate buffer cell insertion. To include hanging capacitance in the library lookup table 208, the same process described in reference to FIG. 3 and the pending U.S. Patent Application entitled CELL INTERCONNECT LIBRARY FOR INTEGRATED CIRCUIT DESIGN, incorporated herein by reference above, is performed except, hanging capacitance, in addition to driving cell type, signal frequency, interconnect type, and interconnect length, is passed along to the file analyzer 206. All combinations of driving cell type, hanging capacitance, input ramp time, and interconnect length are synthesized by the file generator 202 and each combination is analyzed by the file analyzer 206. Capacitance values chosen for hanging capacitance include zero, for the case of no fanout, and values increasing in multiples of a unit capacitance—the capacitance of the smallest buffer cell in the library lookup table 208. The maximum hanging capacitance value for a particular buffer cell type is the largest capacitance that may be driven by that particular driving cell type. For example, for a particular driving cell in the library lookup table 208, the hanging capacitance values associated with that particular driving cell are 0, 1f, 2f, 3f, 4f . . . nf; where f is the unit capacitance and nf is the maximum capacitance for the particular driving cell, i.e., the maximum capacitive load for that particular driving cell. As a result, the library data sets include, but are not necessarily limited to, driving cell type, input ramp time, interconnect length, hanging capacitance and total cell delay.

Within the library lookup table 208, therefore, there exists, for each driving cell within the library lookup table 208, separate tables for each value of hanging capacitance. In other words, within the library lookup table 208, for each driving cell, there is a family of hanging capacitance values, and for each of the hanging capacitance values there is a family of input ramp times, and for each of those input ramp times there is a family of interconnect lengths. Associated with each combination of driving cell type, hanging capacitance, input ramp time, and interconnect length are total cell delay (driving cell delay and interconnect delay) and output ramp time.

In practice, the electronic design interface 212 receives data that represents the model shown in FIG. 6 from the electronic design automation tool 210. For example, the hanging capacitance 602 is retrieved from the electronic design automation tool 210 along with the interconnect length, driving cell type, and input ramp time.

The buffer insertion module 216 then analyzes, as already discussed in reference to FIG. 4, whether a buffer cell should be inserted by comparing the net length of the interconnect path, e.g., E1+E2+E3 with the critical net length for the input ramp time and hanging capacitance stored in the library lookup table 208. If the critical net length is exceeded, the buffer insertion module 216 instructs the electronic design tool 210 to insert a node at that point in the interconnect (representing the critical net length) to indicate where a buffer cell-should be inserted.

The buffer insertion module 216 then continues to analyze the routing data, e.g., driving cell and interconnect information, for that current branch except that if a node was inserted, i.e., the critical net length had already been reached, the driving cell under consideration is now the upstream buffer cell that is to be inserted.

Referring back to FIG. 5, if a buffer cell has been inserted in a branch emanating from a node in the net, then a buffer cell is immediately inserted for this branch at the node of the branch where a buffer cell was inserted. The timing calculation will then start from scratch, i.e., after a buffer cell is inserted, the library lookup table 208 is again referenced with utilizing data reflecting the new net with this buffer cell just inserted. As an example, assume that the interconnect path from the driving cell 502 to the receiving cell R4 required buffer insertion halfway along E4, i.e., halfway between N3 and N4. The buffer insertion module 216 returns to node N3 and places a buffer at the beginning of E3 at N3. Therefore, any receiving cells, e.g. R5, downstream from node N3 via interconnect E3 will now be driven by this buffer cell and that buffer cell is now the driving cell for consideration of whether to insert additional buffer cells along interconnect E3. In other words, the buffer cell to be inserted at N3 will be the driving cell for purposes of accessing the library look up table with driving cell information and interconnect information for E3. Continuing this specific example, when the buffer insertion module 216, returns to node N1 to analyze interconnect E7, a buffer cell will be inserted at N1 because a buffer cell has been inserted in a branch emanating from node N1 at N3. The criteria used for this buffer cell is the load from N1 to R1 and from N2 to R2; R1 and R2 will be isolated, i.e., the load is split. The electronic design automation tool interface 212 then relays the locations of the nodes where buffers are to be inserted and the appropriate buffer cell type for optimization to the electronic design automation tool 210 wherein the electronic design automation tool 210 reconfigures the layout of the interconnects and cells to accommodate the insertion of the buffer cells.

Those of ordinary skill in the art will recognize that different system architectures of the buffer insertion system 101 may be implemented. For example, the electronic design automation tool 210 may be remotely located and accessible via the network 104 while the buffer insertion module 216 is resident on the memory 114 of an end user's computer; alternatively the buffer insertion module may be remotely accessible via the network 114 while the electronic design automation tool 210 is operated at a user's computer. Such a distributed network approach is contemplated and well within the bounds present invention.

While the invention herein disclosed has been described by means of specific embodiments and applications thereof, numerous modifications and variations could be made thereto by those skilled in the art without departing from the scope of the invention set forth in the claims.

What is claimed is:

1. A computer readable medium encoded with instructions for executing steps of:
   performing a cell placement for an integrated circuit design;
   receiving information representative of a driving cell and an interconnect in the integrated circuit design;
   retrieving a previously defined critical net length associated with the driving cell and the interconnect from library lookup table;
   comparing a net length of the interconnect with the previously defined critical net length; and
   if the interconnect length exceeds the previously defined critical net length, then:
      selecting a buffer cell from the library lookup table to meet a given performance constraint for the interconnect; and
      generating as output information representative of the buffer cell for inserting the buffer cell in the interconnect from the library look up table.

2. The computer readable medium of claim 1 wherein the step of receiving information representative of an interconnect includes receiving a net length of the interconnect.

3. The computer readable medium of claim 1 wherein the step of receiving information representative of an interconnect includes receiving hanging capacitance.

4. The computer readable medium of claim 3 wherein the hanging capacitance represents capacitance of branches emanating from the interconnect.

5. The computer readable medium of claim 1 wherein the step of receiving information representative of a driving cell includes receiving input ramp time.

6. The computer readable medium of claim 1 wherein the step of selecting a buffer cell further comprises:
   determining at least one buffer cell location;
   determining at least one type of buffer cell; and
   determining a quantity of the at least one type of buffer cell.

7. The computer readable medium of claim 6 wherein determining at least one type of buffer cell includes selecting at least one type of buffer cell as a function of the net length and an input ramp time.

8. The computer readable medium of claim 6 wherein the step of generating as output information representative of the selected buffer cell for inserting the selected buffer cell in the interconnect further comprises relaying to a layout tool the at least one buffer cell location, the at least one type of buffer cell, and the quantity of the at least one type of buffer cell.

9. A method comprising steps of:
   performing a cell placement for an integrated circuit design;
   receiving information representative of a driving cell and an interconnect in the integrated circuit design;
   retrieving a previously defined critical net length associated with the driving cell and the interconnect from a library lookup table;
   comparing a net length of the interconnect with the previously defined critical net length; and
   if the interconnect length exceeds the previously defined critical net length, then:
      selecting a buffer cell from the library lookup table to meet a given performance constraint for the interconnect; and
      generating as output information representative of the buffer cell for inserting the buffer cell in the interconnect.

10. The method of claim 9 further comprising generating the library lookup table by empirically establishing the information representative of the buffer cell.

11. The method of claim 9 wherein the step of receiving information representative of the interconnect includes receiving a net length of the interconnect.

12. The method of claim 9 wherein the step of receiving information representative of the interconnect includes receiving hanging capacitance of the interconnect from a layout tool.

13. The method of claim 12 wherein the hanging capacitance represents capacitance of branches emanating from the interconnect.

14. The method of claim 9 wherein the step of selecting a buffer cell further comprises:
   determining at least one buffer cell location;
   determining a quantity of buffer cells; and
   determining at least one type of buffer cell.

15. A buffer insertion system comprising:
   a library lookup table;
   receiving means for obtaining information representative of a driving cell and an interconnect;
   buffer determination means for selecting at least one type of buffer cell, a quantity of buffer cells, and a distance between buffer cells from the library lookup table based upon a net length of the interconnect and the information representative of the driving cell; and
   sending means for delivering the at least one type of buffer cell, the quantity of buffer cells, and the distance between buffer cells to a layout tool.

16. The buffer insertion system of claim 15 wherein the receiving means for obtaining information includes means for receiving a net length of the interconnect.

17. The buffer insertion system of claim 15, wherein the buffer determination means includes:

means for selecting a predetermined critical net length from the library lookup table based upon the net length of the interconnect and the information representative of the driving cell; and means for comparing the critical net length of the interconnect with the predetermined net length.

18. A buffer insertion system comprising:

a design automation tool for performing a cell placement for an integrated circuit design;

a design automation tool interface for receiving information representative of a driving cell and an interconnect in the integrated circuit design from the design automation tool;

a library lookup table for identifying a previously defined critical net length associated with the driving cell and the interconnect; and a length comparator for retrieving the previously defined critical net length from the library lookup table, for comparing a net length of the interconnect with the previously defined critical net length, and for selecting a buffer cell for insertion in the interconnect to meet a given performance constraint.

* * * * *